(12) United States Patent
Kaneko et al.

(10) Patent No.: US 6,833,674 B2
(45) Date of Patent: Dec. 21, 2004

(54) HEAT-DISSIPATION STRUCTURE OF PLASMA DISPLAY PANEL DEVICE

(75) Inventors: Koichi Kaneko, Shizuoka-ken (JP); Sadao Yokoi, Shizuoka-ken (JP); Toshiharu Oishi, Shizuoka-ken (JP); Daisuke Takao, Shizuoka-ken (JP)

(73) Assignees: Pioneer Corporation, Shizuoka-ken (JP); Pioneer Display Products Corp., Shizuoka-ken (JP)

( * ) Notice: Subject to any disclaimer, the term of this patent is extended or adjusted under 35 U.S.C. 154(b) by 341 days.

(21) Appl. No.: 09/875,133

(22) Filed: Jun. 7, 2001

(65) Prior Publication Data

US 2002/0014840 A1 Feb. 7, 2002

(30) Foreign Application Priority Data

Jun. 19, 2000  (JP) ........................................ 2000-182445

(51) Int. Cl.$^7$ .............................. H01J 17/49; H01J 1/02
(52) U.S. Cl. ........................... 313/587; 313/46; 313/11; 362/294
(58) Field of Search ................................ 313/11, 45–47, 313/582–587; 315/169.4; 345/60, 87; 349/59, 58, 56, 60; 362/294

(56) References Cited

U.S. PATENT DOCUMENTS 5,086,509 A  *  2/1992  Inubushi et al. ......... 455/575.8
6,366,264 B1 *  4/2002  Kurumada .................... 345/60
6,525,786 B1 *  2/2003  Ono ............................. 349/40

FOREIGN PATENT DOCUMENTS

JP       11251772 A   *  9/1999  ............ H05K/7/20
JP     2002341777 A   * 11/2002  ............ G09F/9/00

* cited by examiner

Primary Examiner—Nimeshkumar D. Patel
Assistant Examiner—German Colón
(74) Attorney, Agent, or Firm—Arent Fox, PLLC

(57) ABSTRACT

In a plasma display panel device including a plasma display panel and a drive circuit for driving the plasma display panel, a plurality of circuit boards (4, 13) are provided, and electronic components (E1', E1", E2') making up the drive circuit are mounted separately on the plurality of circuit boards (4, 13).

8 Claims, 8 Drawing Sheets

10

HEAT-DISSIPATION STRUCTURE OF PLASMA DISPLAY PANEL DEVICE

BACKGROUND OF THE INVENTION

1. Field of the Invention

The invention relates to a structure for dissipating heat generated in a drive unit of a plasma display panel in a plasma display panel device.

The present application claims priority from Japanese Application No. 2000-182445, the disclosure of which is incorporated herein by reference for all purposes.

2. Description of the Related Art

In a plasma display panel (hereinafter referred to as "PDP") a display image is generated by applying a predetermined voltage between electrodes, disposed to intersect with each other, to produce electrical discharge between the electrodes in a discharge space formed between two glass substrates.

The electrodes of the PDP have a high voltage of several hundred volts applied to them. A drive unit developing the high voltage to drive the PDP generates high heat. For this reason, the PDP device needs a heat-dissipation structure for dissipating the heat generated in the drive unit into the atmosphere.

FIG. 8 is a lateral sectional view showing a PDP device having a conventional heat-dissipation structure as explained above.

In FIG. 8, a PDP 1 is secured on a chassis 2 made of metal such as aluminum by an adhesive tape 3. On the back face of the chassis 2 (the reverse of the face on which the PDP 1 is mounted), a circuit board 4 making up a drive circuit for driving the PDP 1 is installed and electrically connected to the PDP 1 through a flexible cable (not shown).

On the circuit board 4, a plurality of electronic components E1 and drive modules E2 which make up the drive circuit are mounted.

The PDP 1 and the circuit board 4 which are linked by the chassis 2 are housed in a casing made up of a side case C1, a rear case C2, a front panel FP for protecting the display surface of the PDP 1, and others.

In an upper portion of the rear case C2, an exhaust fan F is installed for exhausting air from the casing. Heat dissipation is performed such that the exhaust fan F is driven to dissipate the air inside the casing, which is heated by the heat generated from the electronic components E1 and drive modules E2 mounted on the circuit board 4, into the atmosphere.

In the conventional PDP device as explained above, however, the electronic components E1 and the drive modules E2 which generate heat are mounted on one face of the single circuit board 4, which results in a crowded arrangement of the electronic components E1 and the drive modules E2 on the circuit board 4 as illustrated in FIG. 9. Hence, the conventional PDP device has a problem in which a heat-dissipating path for creating an air flow for the heat dissipation produced by the exhaust fan F cannot be provided sufficiently between the electronic components E1 and between the drive modules E2.

SUMMARY OF THE INVENTION

The present invention has been made to solve the problem associated with heat dissipation in the conventional plasma display panel as described above.

It is therefore an object of the present invention to provide a heat-dissipation structure capable of performing efficient heat dissipation in a plasma display panel device.

To attain the above object, a heat-dissipation structure of a plasma display panel device including a plasma display panel and a drive circuit for driving the plasma display panel, according to a first aspect of the present invention, has the feature of including a plurality of circuit boards and having electronic components, making up the drive circuit, mounted separately on the plurality of circuit boards.

With the heat-dissipation structure of the plasma display panel device of the first aspect, the electronic components making up the drive circuit for the plasma display panel are mounted separately on the plurality of individual circuit boards. For this reason, it is possible to increase each space between the adjacent electronic components as compared with the case where the electronic components are mounted on a single circuit board.

According to the first aspect, therefore, the heat dissipating path for creating an air flow in order to dissipate the heat, generated from the heat-generating electronic components, from the plasma display panel device into the atmosphere, can be provided sufficiently between the heat-generating electronic components, resulting in efficient heat dissipation.

This allows the elimination of the conventional need for installing an exhaust fan for dissipating heat. If exhaust fans are installed, it is possible to reduce the number of exhaust fans.

To attain the aforementioned object, the heat-dissipation structure of the plasma display panel according to a second aspect has, in addition to the configuration of the first aspect, the feature that an electronic component with the heat-generating property out of the electronic components making up the drive circuit is mounted on a required circuit board out of the plurality of circuit boards.

With this structure, it is possible to place an exhaust hole, an exhaust fan or the like above the required circuit board on which the electronic component with the heat-generating property is mounted for collective exhausting, which results in further efficiency in performing the heat dissipation.

To attain the aforementioned object, the heat-dissipation structure of the plasma display panel device according to a third aspect has, in addition to the configuration of the second aspect, the feature that the required circuit board is supported by a metal-made build-up frame which is thermally-conductively installed on a metal-made casing of the plasma display panel device and is in contact with at least part of the electronic components with the heat-generating property mounted on the required circuit board.

According to the heat dissipation structure of the plasma display panel device of the third aspect, in addition to the heat dissipation achieved by exhausting the heated air flowing between the electronic components with the heat-generating property mounted on the required circuit board, the heat generated from the electronic components, with the heat-generating property, in contact with the metal-made build-up frame is transferred through the build-up frame to the metal-made casing of the plasma display panel device and also dissipated from the metal-made casing, resulting in further efficiency in performing the heat dissipation.

To attain the aforementioned object, the heat-dissipation structure of the plasma display panel according to a fourth aspect has, in addition to the configuration of the third aspect, the feature that the electronic components having the heat-generating property are mounted separately on both faces of the required circuit board, and the electronic component mounted on one face of the required circuit board are in contact with the build-up frame.

With this structure, it is possible to further increase a width of the heat dissipating path between the electronic components having the heat-generating property. In addition, the heat generated by the electronic components mounted on the one face of the circuit board is passed through the build-up frame and dissipated from the metal-made casing of the plasma display panel device into the atmosphere, resulting in further efficiency in performing the heat dissipation.

To attain the aforementioned object, the heat-dissipation structure of the plasma display panel according to a fifth aspect has, in addition to the configuration of the third aspect, the feature that the electronic component mounted on the one face of the required circuit board and being in contact with the build-up frame is a heat-generating module.

With this structure, electronic components having the heat-generating property are designed in modules, and the heat generated by the heat-generating module significantly exhibiting heat-generating property is dissipated by means of transferring the heat to the metal-made casing of the plasma display panel device, as well as means of exhausting the heated air. This results in further efficiency in performing the heat dissipation.

To attain the aforementioned object, the heat-dissipation structure of the plasma display panel according to a sixth aspect has, in addition to the configuration of the second aspect, the feature that part of the electronic components with the heat-generating property out of the electronic components making up the drive circuit is mounted on the required circuit board out of the plurality of circuit boards, and anther electronic component with the heat-generating property is mounted on a circuit board out of the plurality of circuit boards other than the required circuit board while being in thermal-conductive contact with the metal-made casing of the plasma display panel device.

According to the heat-dissipation structure of the plasma display panel device of the sixth aspect, the heat generated by the another electronic components with the heat-generating property mounted on the circuit board other than the required circuit board is dissipated by means of transferring the heat to the metal-made casing of the plasma display panel device, as well as means of exhausting the heated air. This results in further efficiency in performing the heat dissipation.

Further, it is not required to mount the electronic components having the heat-generating property on both faces of the single circuit board in order to make thermal-conductive contact between part of the electronic components having the heat-generating property and the metal-made casing of the plasma display panel device. For this reason, it is possible to minimize an increase in depth dimension of the plasma display panel device due to the provision of the heat-dissipation structure.

To attain the aforementioned object, the heat-dissipation structure of the plasma display panel according to a seventh aspect has, in addition to the configuration of the sixth aspect, the feature that the another electronic component with the heat-generating property is thermal-conductively installed to the metal-made casing of the plasma display panel device and is in contact with a metal-made build-up frame supporting the required circuit board.

With this structure, the heat produced by the another electronic component with the heat-generating property is transferred through the metal-made build-up frame supporting the required circuit board to the metal-made casing of the plasma display device to be dissipated from the casing into the atmosphere.

To attain the aforementioned object, the heat-dissipation structure of the plasma display panel according to an eighth aspect has, in addition to the configuration of the sixth aspect, the feature that the another electronic components with the heat-generating property are a heat-generating module.

With this structure, the electronic components having the heat-generating property are designated in modules, and the heat produced by the resulting heat-generating module significantly exhibiting the heat-generating property is dissipated by means of transferring the heat to the metal-made casing of the plasma display panel device, as well as means of exhausting the heated air. This results in further efficiency in performing the heat dissipation.

To attain the aforementioned object, a heat-dissipation structure of a plasma display panel including a plasma display panel and a drive circuit for driving the plasma display panel according to a ninth aspect of the present invention has the feature that electronic components making up the drive circuit are mounted separately on both faces of a circuit board.

With the heat dissipation structure of the plasma display panel device of the ninth aspect, since the electronic components making up the drive circuit for the plasma display panel are mounted separately on both faces of the circuit board, it is possible to increase each space between the electronic components arranged thereon as compared with the case where the electronic components are mounted on one of the faces of the circuit board.

According to the ninth aspect, therefore, it is permitted that a heat-dissipating path for making air flow in order to dissipate the heat produced by the heat-generating electronic component from the plasma display panel device into the atmosphere, is provided sufficiently between the heat-generating electronic components, resulting in efficiency in performing the heat dissipation. Further, since there is no need for providing the circuit boards in plural in order to mount the electronic components separately, it is possible to reduce depth dimension of the plasma display panel device.

To attain the aforementioned object, the heat-dissipation structure of the plasma display panel according to a tenth aspect has, in addition to the configuration of the ninth aspect, the feature that the circuit board having both the faces on which the electrode components are separately mounted is supported by a metal-made build-up frame installed thermal-conductively to the metal-made casing of the plasma display panel device and being in contact with part of at least the electronic components with the heat-generating property out of the electronic components mounted on the circuit board.

According to the tenth aspect of the heat dissipation structure of the plasma display panel device, in addition to the heat dissipation achieved by exhausting the heated air flowing between the electronic components with the heat-generating property mounted on the circuit board, the heat generated by the electronic components with the heat-generating property which are in contact with the metal-made build-up frame, is transferred through the build-up frame to the metal-made casing of the plasma display panel device to be dissipated also from the metal-made casing, resulting in further efficiency in performing the heat dissipation.

To attain the aforementioned object, the heat-dissipation structure of the plasma display panel according to an eleventh aspect has, in addition to the configuration of the tenth aspect, the feature that the electronic component mounted on the circuit board while being in contact with the build-up frame is a heat-generating module.

With this structure, the electronic components having the heat-generating property are designed in modules, and the heat generated by the resulting heat-generating module significantly exhibiting the heat-generating property is dissipated by means of transferring the heat to the metal-made casing of the plasma display panel device, as well as means of exhausting the heated air. This results in further efficiency in performing the heat dissipation.

DETAILED DESCRIPTION OF THE PREFERRED EMBODIMENT

Most preferred embodiment according to the present invention will be described hereinafter in detail with reference to the accompanying drawings.

Figure 1:
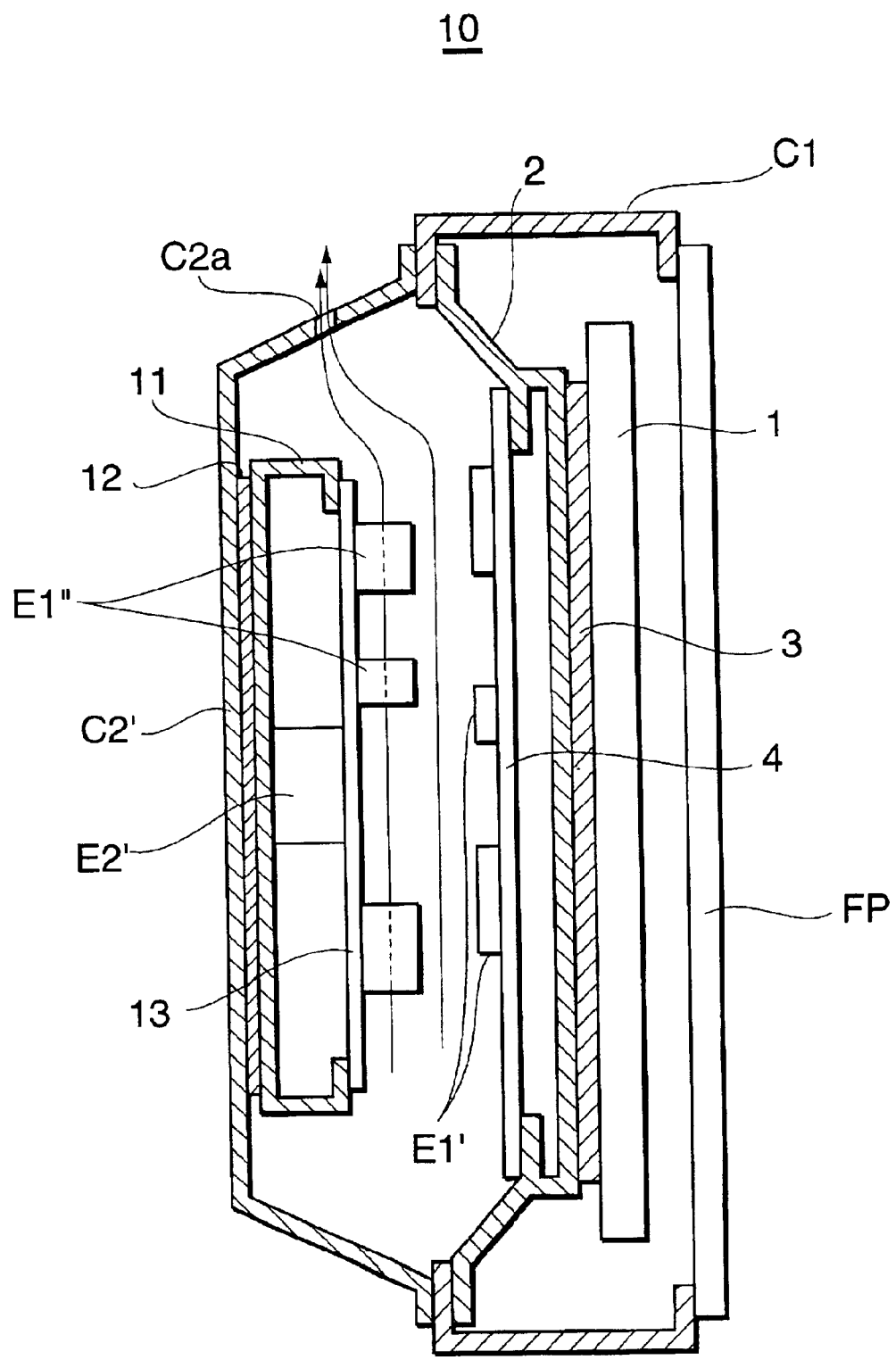
FIG. 1 is a lateral sectional view illustrating a first example according to a preferred embodiment of the present invention.

FIG. 1 is a lateral sectional view illustrating a first example according to the preferred embodiment of the present invention.

Figure 8:
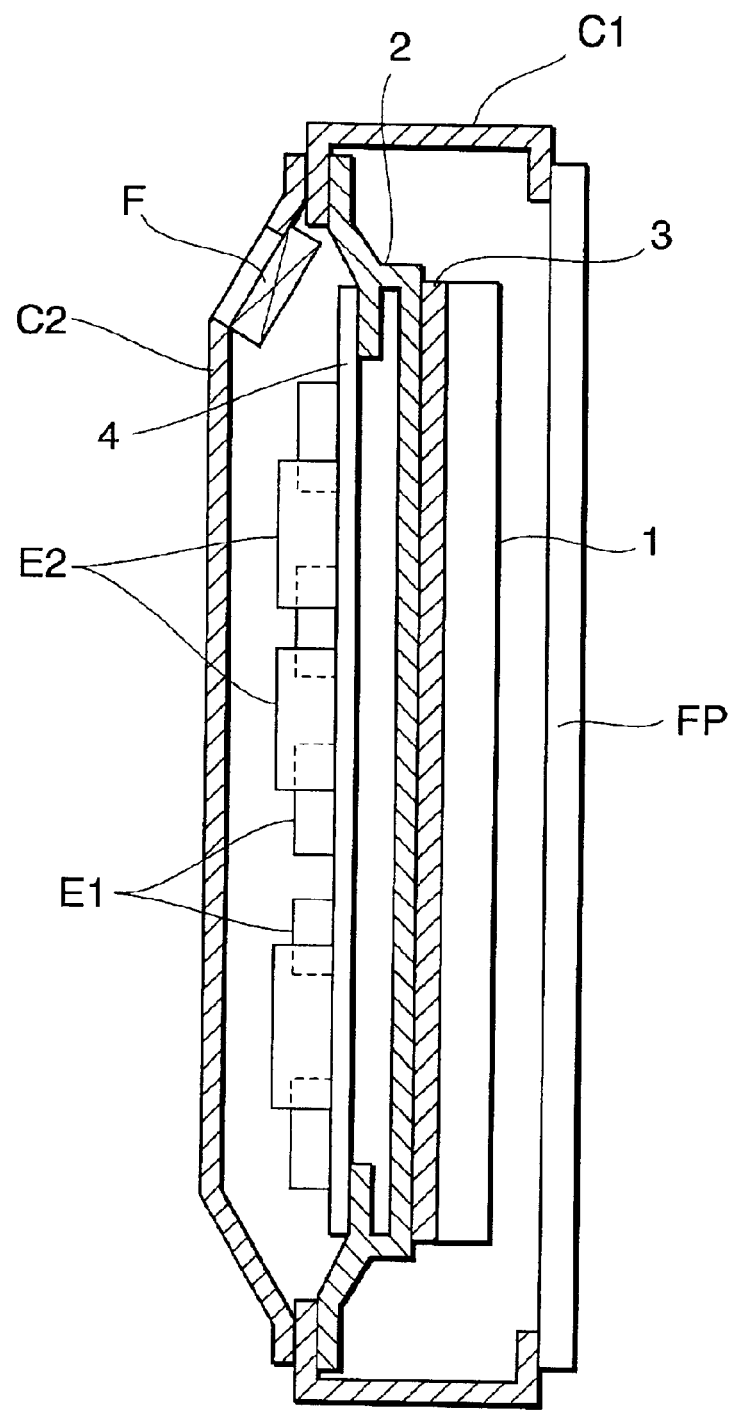
FIG. 8 is a lateral sectional view illustrating an example of the prior art.
Figure 9:
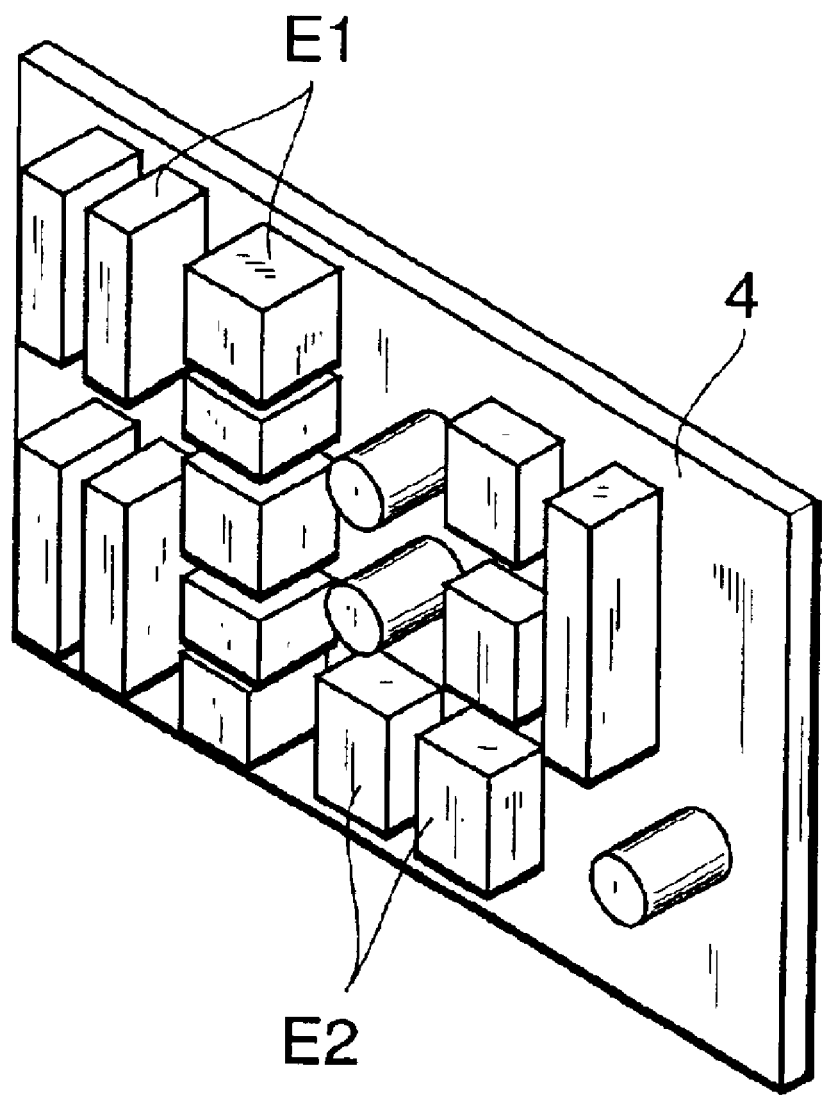
FIG. 9 is a perspective view illustrating arrangement of electronic components mounted on a circuit board in the prior art.

Referring to FIG. 1, in a plasma display panel device (hereinafter referred to as a "PDP device") 10, as in the case of the conventional PDP device of FIG. 8, a PDP 1 is secured on a chassis 2 by an adhesive tape 3. On the back face of the chassis 2 (the reverse of the face on which the PDP 1 is mounted), a circuit board 4 making up a drive circuit for driving the DPD 1 is installed and electrically connected to the PDP 1 through a flexible cable (not shown).

The PDP 1 and the circuit board 4 which are jointed by the chassis 2 are housed in a casing made up of a side case C1, a metal-made rear case C2', a front panel FP for protecting the display surface of the PDP 1, and others.

In the above configuration, the components equivalent to those used in DESCRIPTION OF THE RELATED ART are designated by the same reference numerals.

The circuit board 4 has mounted on its back face (the reverse of the face on which the PDP 1 is mounted) a electronic component E1' exhibiting a less heat-generating property out of electronic components which are one part of the electronic components E1 and drive modules E2 which together make up a drive circuit of the PDP.

On an inner wall face of the rear case C2' opposing the circuit board 4, a heat-dissipative chassis 11 formed of metal such as aluminum is fixed through a thermal conductor 12. A circuit board 13 is installed on and supported by the heat-dissipative chassis 11.

On the front face of the circuit board 13 opposing the circuit board 4, electronic components E1" significantly exhibiting the heat-generating property out of the electronic components are mounted. Further, on the back face of the circuit board 13 opposing the rear case C2', high heat-generating modules E2' are mounted in such a way that the opposite face to the face mounted on the circuit board 13 is in close contact with the heat-dissipative chassis 11.

The rear case C2' includes an exhaust hole C2a at a portion situated above the heat-dissipative chassis 11.

With the PDP device 10, the circuit board 13 is placed in isolation from the circuit board 4. The electronic components E1" significantly exhibiting the heat-generating property out of the electronic components and the high heat-generating modules E2' are mounted on the circuit board 13. Better still, the electronic component E1" significantly exhibiting the heat-generating property and the high heat-generating module E2' are disposed separately on the front face and the back face of the circuit board 13.

Figure 2:
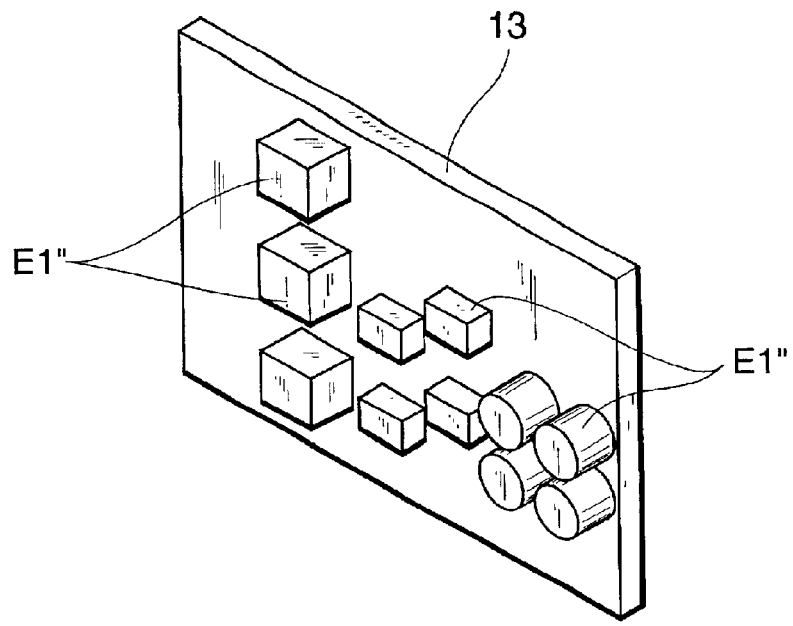
FIG. 2 is a perspective view illustrating arrangement of electronic components mounted on one face of a circuit board in the first example.
Figure 3:
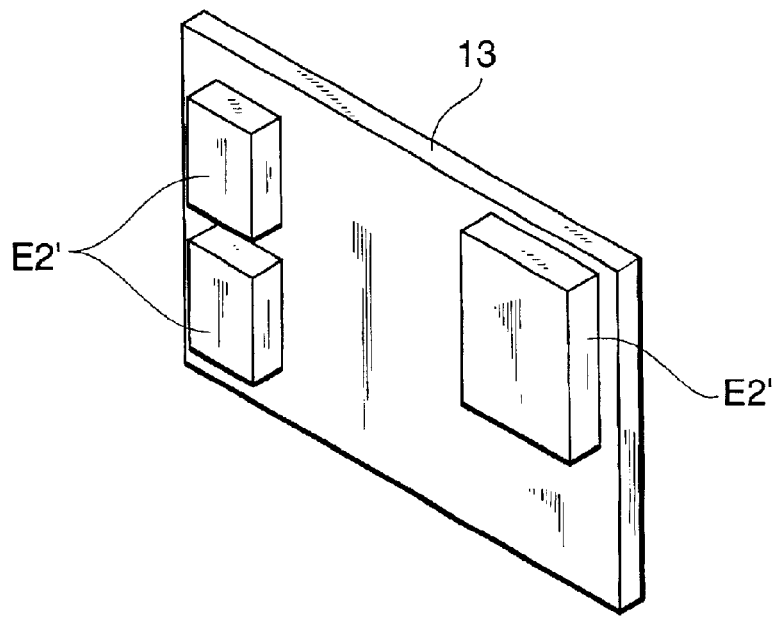
FIG. 3 is a perspective view illustrating arrangement of electronic components mounted on the other face of the circuit board.

For this reason, as is seen from FIG. 2 illustrating the arrangement of the electronic components E1" mounted on the front face of the heat-dissipating chassis 11 and FIG. 3 illustrating the arrangement of the high heat-generating modules E2' mounted on the back face, each of spaces between the electronic components E1" and between the high exothermic modules E2' is set so as to be large. This allows sufficient heat-dissipating paths.

As a result of the contact of the high heat-generating module E2' with the heat-dissipative chassis 11, heat generated from the high heat-generating module E2' is transferred through the heat-dissipative chassis 11 and the thermal conductor 12 to the metal-made rear case C2', and then is dissipated from the rear case C2' into the atmosphere.

As described hereinbefore, in the PDP device 10, the air heated by the heat generation of the electronic component E1" and the high heat-generating module E2' moves upward through the heat-dissipating paths formed between the electronic components E1" and between the modules E2', and then is exhausted from the exhaust hole C2a, provided in the upper portion of the rear case C2', to the outside of the casing. Moreover, the heat generated by the high heat-generating module E2' is transferred through the heat-dissipative chassis 11 and the thermal conductor 12 to the rear case C2' to be dissipated therefrom into the atmosphere. Thus, the heat dissipation from the inside of the casing is performed efficiently.

In consequence, the provision of the heat dissipation structure as described above eliminates the conventional need of installing an exhaust fan for forcibly exhausting the heated air inside a casing. If exhaust fans are installed, it is possible to reduce the number of exhaust fans.

Figure 4:
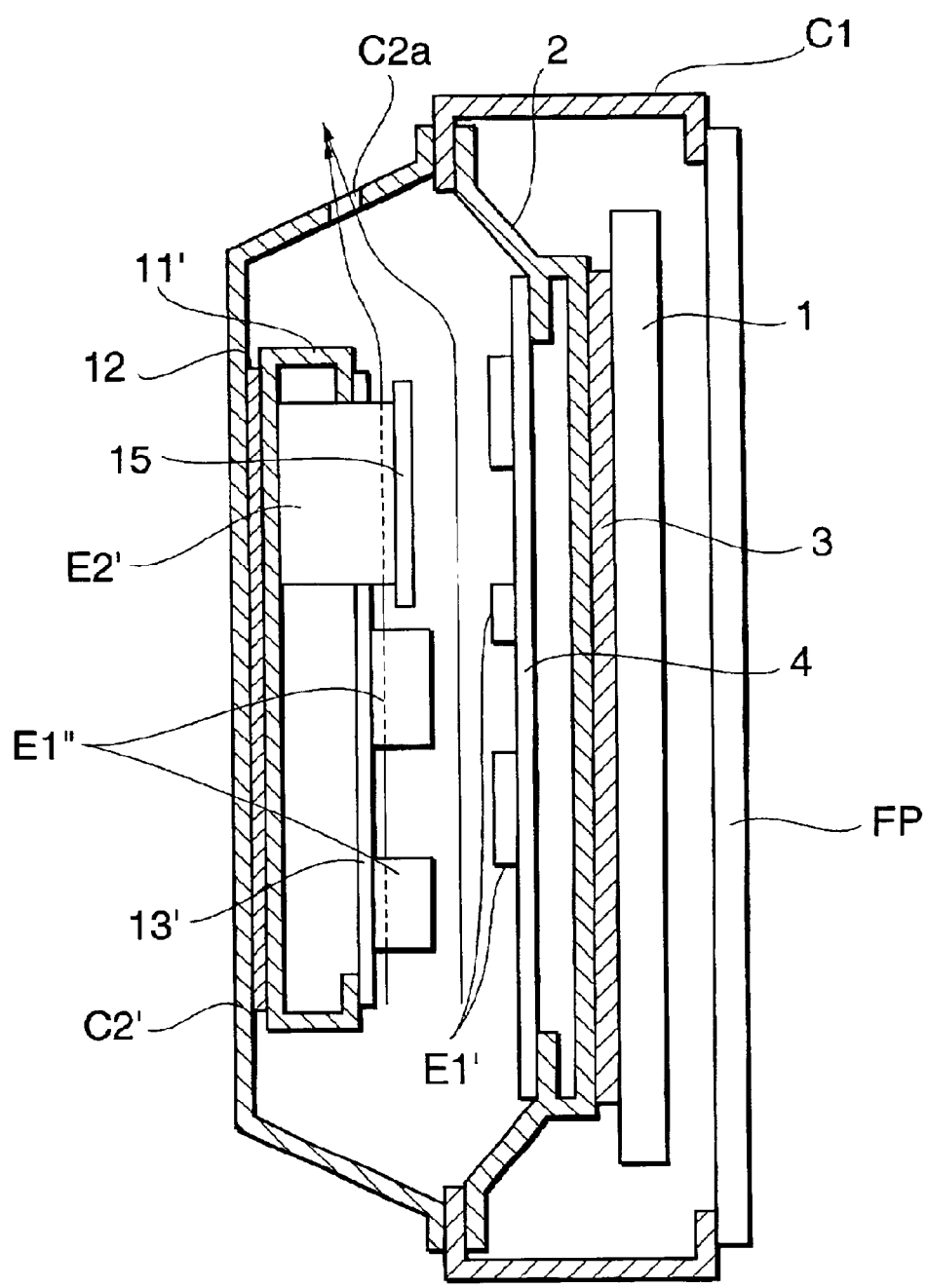
FIG. 4 is a lateral sectional view illustrating a second example according to the preferred embodiment of the present invention.

FIG. 4 is a lateral sectional view illustrating a second example according to the embodiment of the present invention.

Similarly to the PDP device of the first example, in a PDP device 20 of the second example, a circuit board 13' independent of a circuit board 4 is supported by a heat-dissipative chassis 11' installed through a thermal conductor 12 to a rear case C2', and therefore, is disposed at a position opposing the circuit board 4. An electron component E1" with the heat-generating property is mounted on the front face of the circuit board 13' opposing the circuit board 4.

Figure 5:
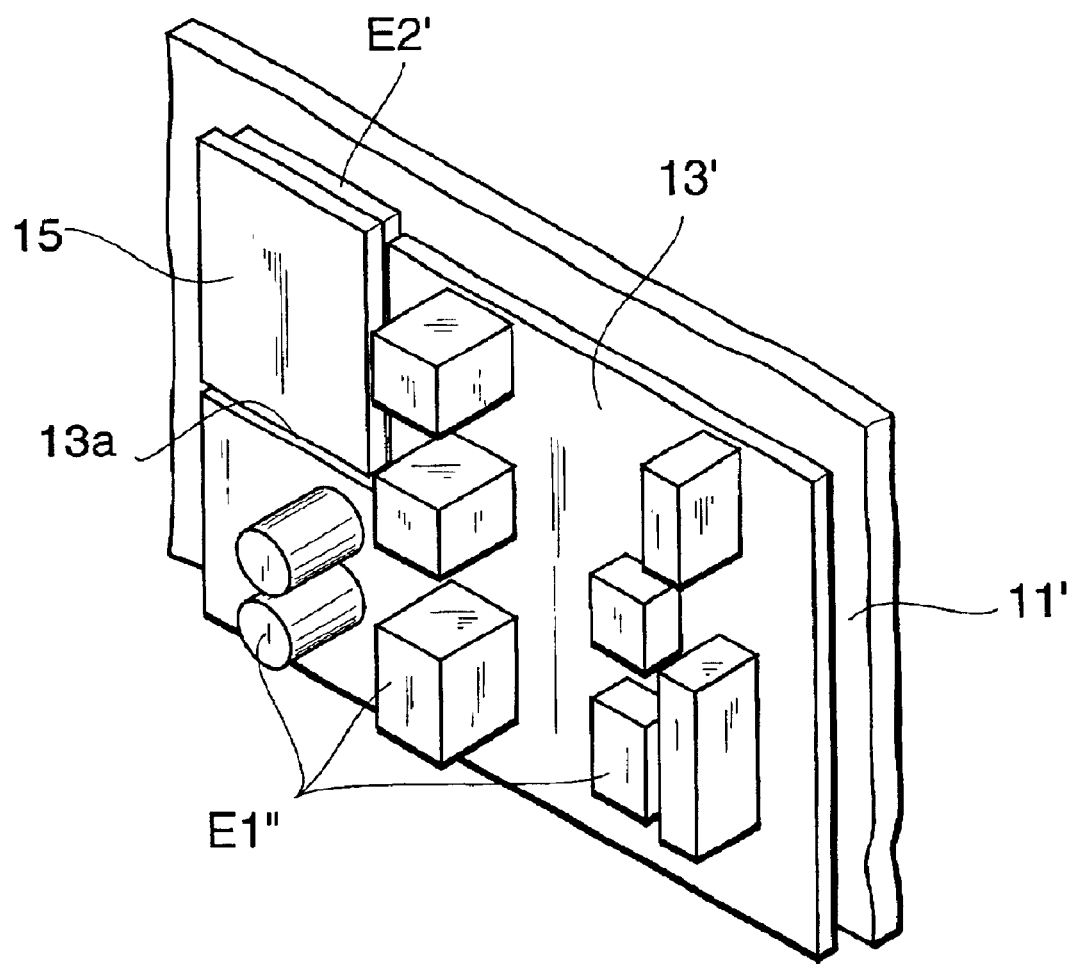
FIG. 5 is a perspective view illustrating arrangement of circuit boards in the second embodiment.

As is clear from FIG. 5, the circuit board 13' is formed with a notch 13a in the upper left corner in FIG. 5.

While a high heat-generating module E2' is secured to and has a back face in close contact with the heat-dissipative chassis 11', it is disposed in the notch 13a of the circuit board 13'. Further, the module E2' is mounted on a circuit board 15 such that a face thereof opposing the circuit board 4 faces the circuit board 15.

The remaining configuration of the PDP device 20 is approximately the same as that of the PDP device 10 in the first example, and the same reference numerals are used.

With the PDP device 20 in the second example as well, the electronic component E1" significantly exhibiting the heat-generating property out of the electronic components and the high heat-generating modules E2' are mounted on the circuit board 13' and the circuit board 15, which are provided in isolate from the circuit board 4. Hence, each of spaces between the electronic components E1" and between the high heat-generating property modules E2' is set so as to be large. This allows sufficient heat-dissipating paths, and allows heat generated from the high heat-generating module E2' to be transferred to the rear case C2' and dissipated therefrom, resulting in effective heat dissipation.

In addition, in the PDP device 20, the high heat-generating module E2' is mounted on the circuit board 15 provided independently of the circuit board 13', and disposed in the notch 13a formed in the circuit board 13'. This allows a minimizing of the increase in the depth dimension of the PDP device due to the provision of the foregoing heat-dissipation structure.

Figure 6:
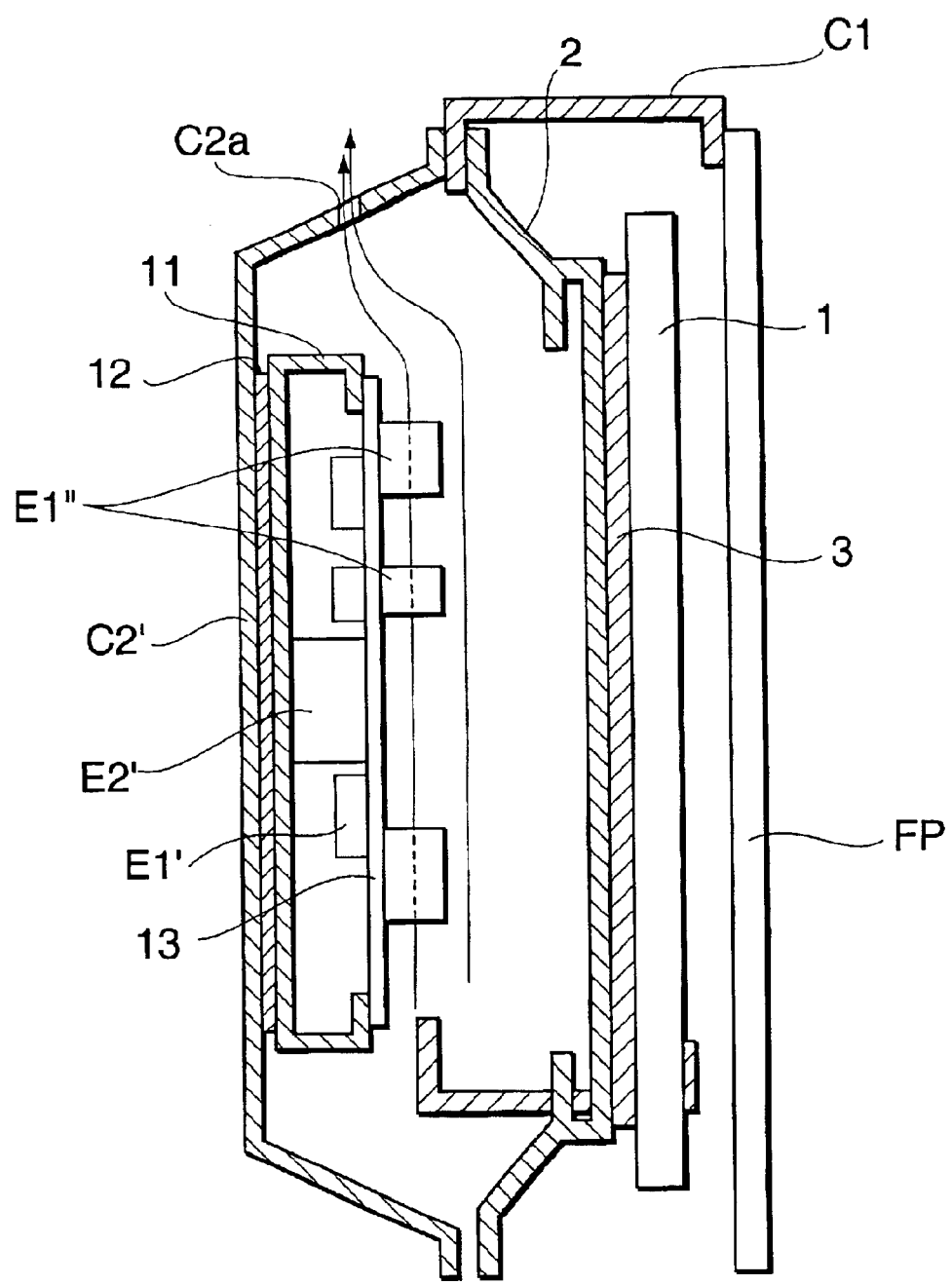
FIG. 6 is a lateral sectional view illustrating a third example according to the preferred embodiment of the present invention.

FIG. 6 is a lateral sectional view illustrating a third example according to the embodiment of the present invention.

A PDP device 30 in FIG. 6 does not include a circuit board corresponding to the circuit board 4 of the PDP device 10 in FIG. 1, and includes electronic components E1', E1", E2' mounted separately on both the faces of a circuit board 13. The remaining configuration is approximately the same as that of the PDP device 10 in FIG. 1, and the same reference numerals are used.

Figure 7:
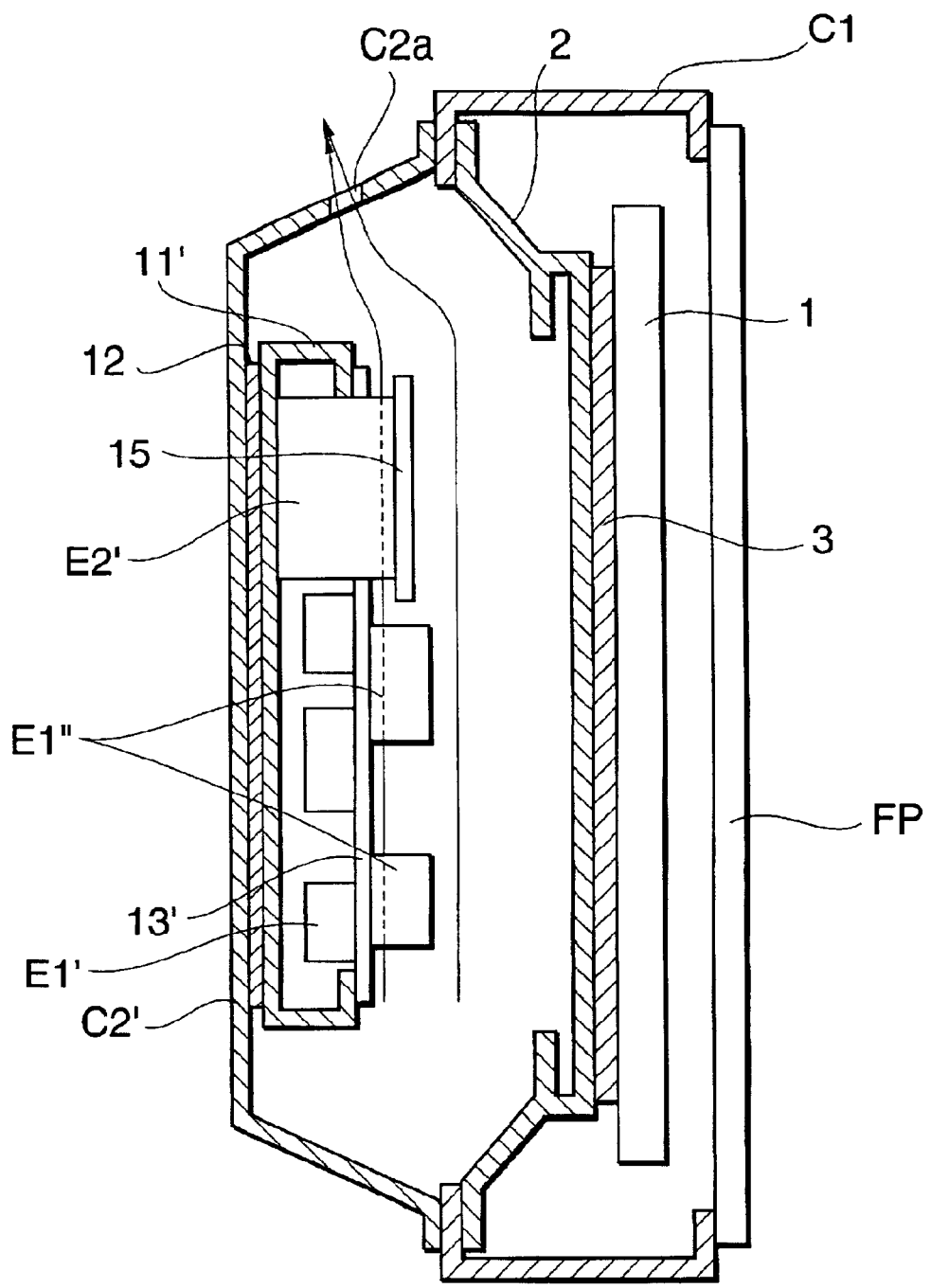
FIG. 7 is a lateral sectional view illustrating a fourth example according to a preferred embodiment of the present invention.

FIG. 7 is a lateral sectional view illustrating a fourth example according to the embodiment of the present invention.

A PDP device 40 in FIG. 7 does not include a circuit board corresponding to the circuit board 4 of the PDP device 20 in FIG. 4, and includes electronic components E1', E1" mounted separately on both the faces of a circuit board 13'. The remaining configuration is approximately the same as that of the PDP device 20 in FIG. 4, and the same reference numerals are used.

In both the PDP device 30 of the third example and the PDP device 40 of the fourth example, sufficient heat dissipating paths are provided between the electronic components by means of mounting the electronic components separately on both the faces of the circuit board, as in the cases of the first and second examples. Further, the heat dissipation is efficiently performed by means of transferring heat to the rear case C2'.

Further, each of the PDP devices 30 and 40 has a smaller number of circuit boards as compared with that of the PDP devices of the first and second example, which reduces the depth dimension of the PDP device.

The terms and description used herein are set forth by way of illustration only and are not meant as limitations. Those skilled in the art will recognize that numerous variations are possible within the spirit and scope of the invention as defined in the following claims.

What is claimed is:

1. A heat-dissipation structure of a plasma display panel device including a plasma display panel and a drive circuit for driving the plasma display panel, comprising:

a plurality of circuit boards; and electronic components making up the drive circuit and mounted separated on said plurality of circuit boards, wherein said plurality of circuit boards are arranged approximately in parallel to each other, wherein an electronic component with heat-generating property out of said electronic components making up the drive circuit is mounted on a required circuit board out of said plurality of circuit boards, and wherein said required circuit board is supported by a metal-made build-up frame thermally-conductively installed on a metal-made casing of the plasma display panel device and being in contact with at least cart of said electronic components with heat-generating property mounted on the required circuit board.

2. The heat-dissipation structure of the plasma display panel according to claim 1, wherein said electronic components with said heat-generating property are mounted separately on both faces of said required circuit board, and the electronic component mounted on one face of the required circuit board are in contact with said build-up frame.

3. The heat-dissipation structure of the plasma display panel according to claim 2, wherein said electronic component mounted on the one face of said required circuit board and being in contact with said build-up frame is a heat-generating module.

4. A heat-dissipation structure of a plasma display panel including a plasma display panel and a drive circuit for driving the plasma display panel, comprising electronic components making up the drive circuit and mounted separately on both faces of a circuit board;

wherein said circuit board having both the faces on which said electronic components are separately mounted is supported by a metal-made build-up frame, installed thermal conductively to a metal-made casing of the plasma display panel device and being in contact with part of at least the electronic components with heat-generating property out of the electronic components mounted on the circuit board.

5. The heat-dissipation structure of the plasma display panel according to claim 4, wherein the electronic components mounted on said circuit board and being in contact with the build-up frame include a heat-generating module.

6. A heat-dissipation structure of a plasma display panel device including a plasma display panel and a drive circuit for driving the plasma display panel, comprising:

a plurality of circuit boards; and electronic components making up the drive circuit and mounted separated on said plurality of circuit boards, wherein said plurality of circuit board are arranged approximately in parallel to each other, and wherein part of the electronic components with heat-generating property out of said electronic components making up the drive circuit is mounted on a required circuit board out of said plurality of circuit boards, and another electronic component with heat-generating property is mounted on a circuit board out of said plurality of circuit boards other than said required circuit board while being in thermal-conductive contact with a metal-made casing of the plasma display panel device.

7. The heat-dissipation structure of the plasma display panel according to claim 6, wherein said another electronic component with the heat-generating property is thermal-conductively installed to the metal-made casing of the plasma display panel device and is in contact with a metal-made build-up frame supporting said required circuit board.

8. The heat-dissipation structure of the plasma display panel according to claim 6, wherein said another electronic component with the heat-generating property is a heat-generating module.

\* \* \* \* \*